United States Patent [19]
Kawamoto

[11] Patent Number: 6,043,510
[45] Date of Patent: Mar. 28, 2000

[54] MOLECULE-DOPED NEGATIVE-RESISTANCE DEVICE AND METHOD FOR MANUFACTURING THE SAME

[75] Inventor: Akira Kawamoto, 57-5-13, Hirai-cho, Sabae-shi, Fukui 916, Japan

[73] Assignees: Akira Kawamoto; Organet Chemical Co., Ltd., both of Fukui, Japan

[21] Appl. No.: 09/000,082

[22] PCT Filed: May 14, 1997

[86] PCT No.: PCT/JP97/01615

§ 371 Date: Jan. 22, 1998

§ 102(e) Date: Jan. 22, 1998

[87] PCT Pub. No.: WO97/44829

PCT Pub. Date: Nov. 27, 1997

[30]    Foreign Application Priority Data

May 22, 1996  [JP]  Japan ..................... 8-126980

[51] Int. Cl.[7] ........................................... H11L 35/24
[52] U.S. Cl. .................. 257/40; 257/25; 428/99
[58] Field of Search .......... 257/25, 40; 428/99, 428/957

[56]    References Cited

U.S. PATENT DOCUMENTS

| | | | |
|---|---|---|---|
| 4,371,883 | 2/1983 | Potember et al. | 357/8 |
| 4,735,852 | 4/1988 | Osada | 428/336 |
| 5,185,208 | 2/1993 | Yamashita et al. | 428/411.1 |
| 5,294,810 | 3/1994 | Egusa et al. | 257/40 |
| 5,294,820 | 3/1994 | Gemma et al. | 257/324 |
| 5,359,204 | 10/1994 | Eguchi et al. | 257/2 |

FOREIGN PATENT DOCUMENTS

| | | |
|---|---|---|
| 0252756A2 | 1/1988 | European Pat. Off. . |
| 6029556A | 2/1994 | Japan . |
| 629556 | 2/1994 | Japan . |
| 5259533A | 10/1998 | Japan . |

OTHER PUBLICATIONS

Wang, Y.H., *Applied Physics Letter*, vol. 57, No. 15, pp. 1546–1547, (Oct. 8, 1990).

Heun, S. et al., *Physica B Condensed Matter*, vol. 216, No. 1/02, pp. 43–52, (Dec. 1, 1995).

Pai, D. M. et al., *Journal of Physical Chemistry*, vol. 88, No. 20, pp. 4714–4717, (Sep. 27, 1984).

(List continued on next page.)

*Primary Examiner*—Sara Crane
*Attorney, Agent, or Firm*—Birch, Stewart, Kolasch & Birch, LLP

[57]         ABSTRACT

There is provided a negative-resistance device which is easier to manufacture and can be manufactured at a lower cost as compared with the prior art, and yet has a comparatively large PV ratio, and a method for manufacturing the same. The negative-resistance device is a molecular-doped negative-resistance device which comprises a molecular-doped layer (2) made of an electron transporting lower molecular organic compound, in which the molecular-doped layer (2) is formed to be sandwiched between a pair of electrodes (2, 4), in which respective molecules of said electron transporting lower molecular organic compound are isolated from one another by an electrically insulating organic polymer, and in which said molecular-doped negative-resistance device has a negative-resistance. By doping the lower molecular organic compound in the electrically insulating organic polymer, the molecular-doped layer (3) has a multiple barrier type molecular doping structure, such that contacts each between the organic polymer and a molecule of the lower molecular organic compound are repeated in an alternate order of the organic polymer and the molecule of the lower molecular organic compound. The lower molecular organic compound is preferably a triphenyldiamine derivative or 8-hydroxy-quinoline aluminum, and the organic polymer is poly (N-vinylcarbazole) or polystyrene.

5 Claims, 14 Drawing Sheets

OTHER PUBLICATIONS

Johnson, G. E. et al., Proceedings of the SPIE, vol. 1910, *Electroluminscent Materials, Devices, and Large–Screen Displays, San Jose, CA, USA*, pp. 6–14, (Feb. 1–2, 1993).

Yuguang, M. A. et al., *Chinese Physics Letters*, vol. 11, No 7, pp. 454–456, (1994).

Yutaka Ohmari et al., "Organic Quantum Well Structure EL Device", Japan Society of Applied Physics, vol. 64, No. 3, pp. 246–249, 1995 (with English Abstract).

Takayuki Nakagawa et al., "Effect of Prewell Insertion in InGaAs/AlAs/In As resonant tunneling diodes", Papers at Autumn General Meeting, 1995 of the Japan Society of Applied Physics Society, 29a–Zm–8, 1995 (with partial English translation).

Fig.1 Plan View
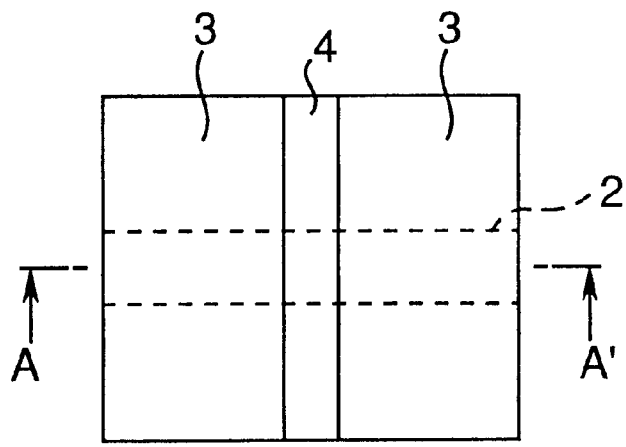
Fig.2 Sectional View
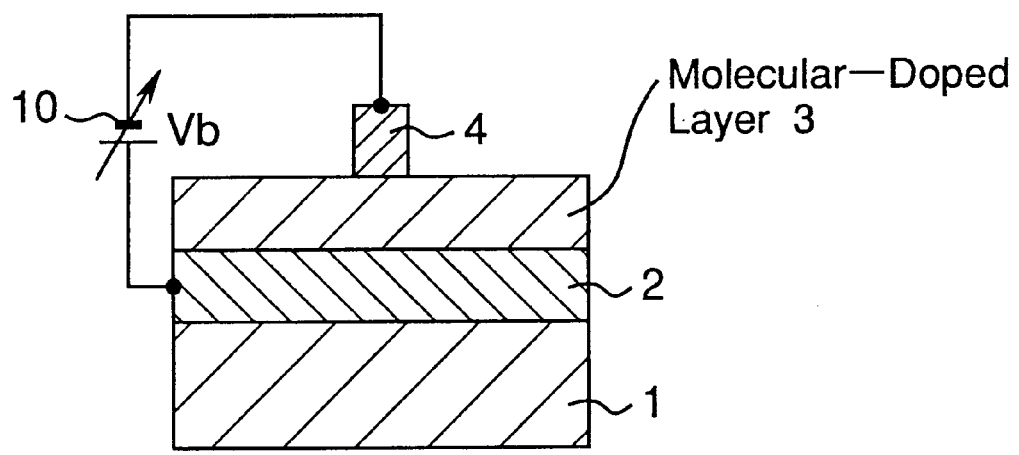

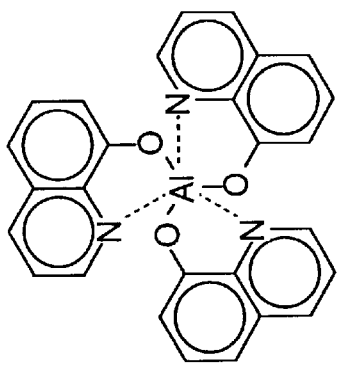
Fig.4  8-Hydroxy-Quinoline Aluminum (Alq₃)
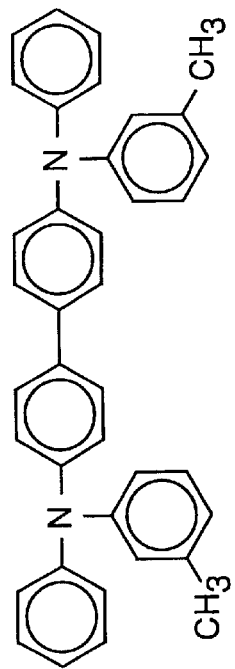
Fig.3  Triphenyl Diamine Derivative (TPD)
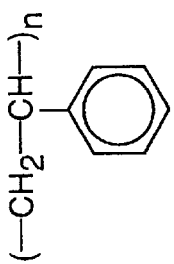
Fig.6  Polystyrene (PS)
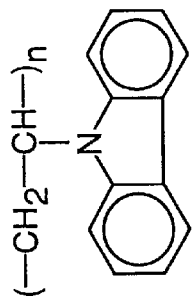
Fig.5  Poly(N-Vinylcarbazole)

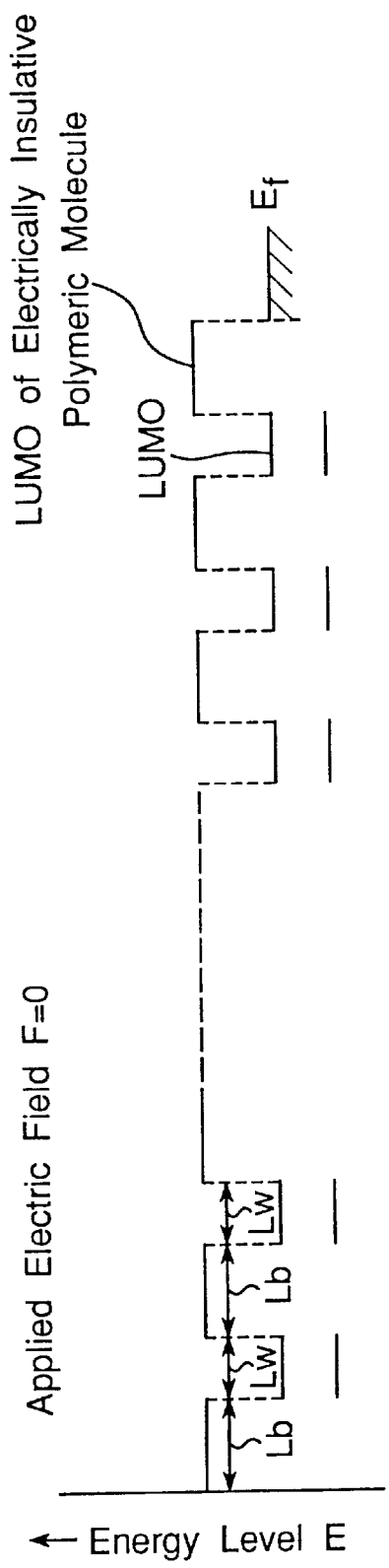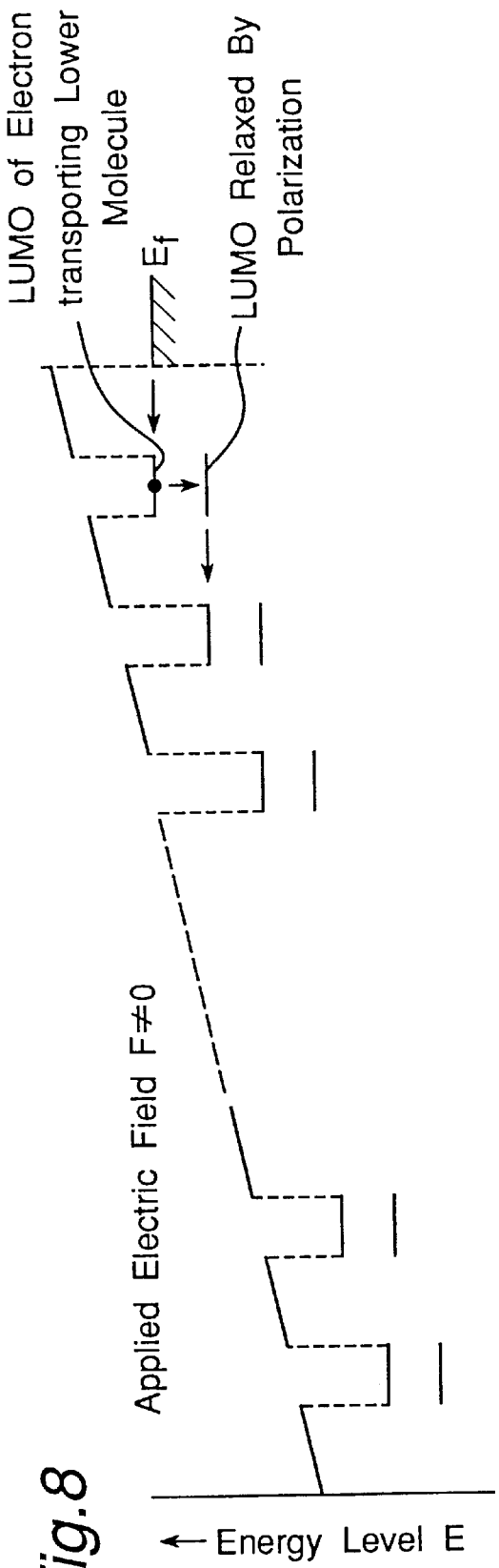
Fig. 7 Principle of Operation of Negative Resistor Device By Tunneling Electron
Fig. 8

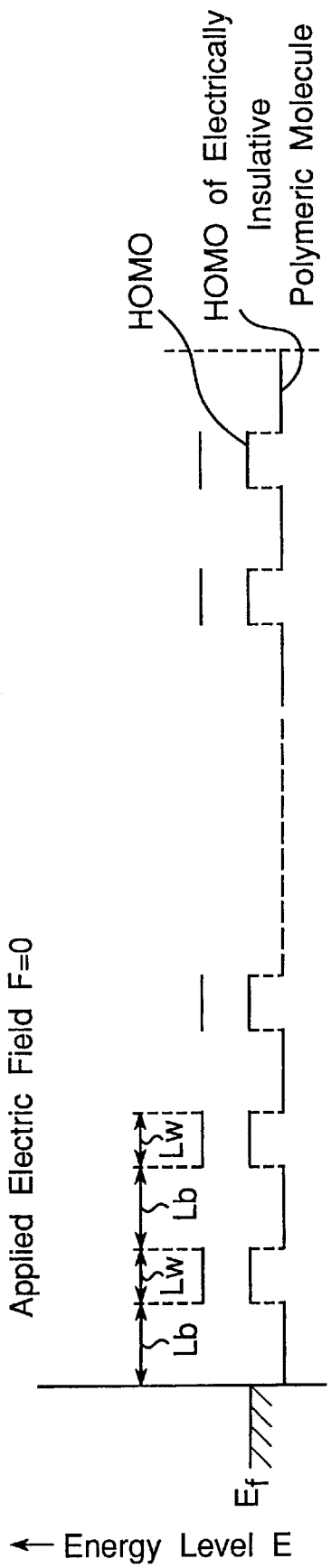
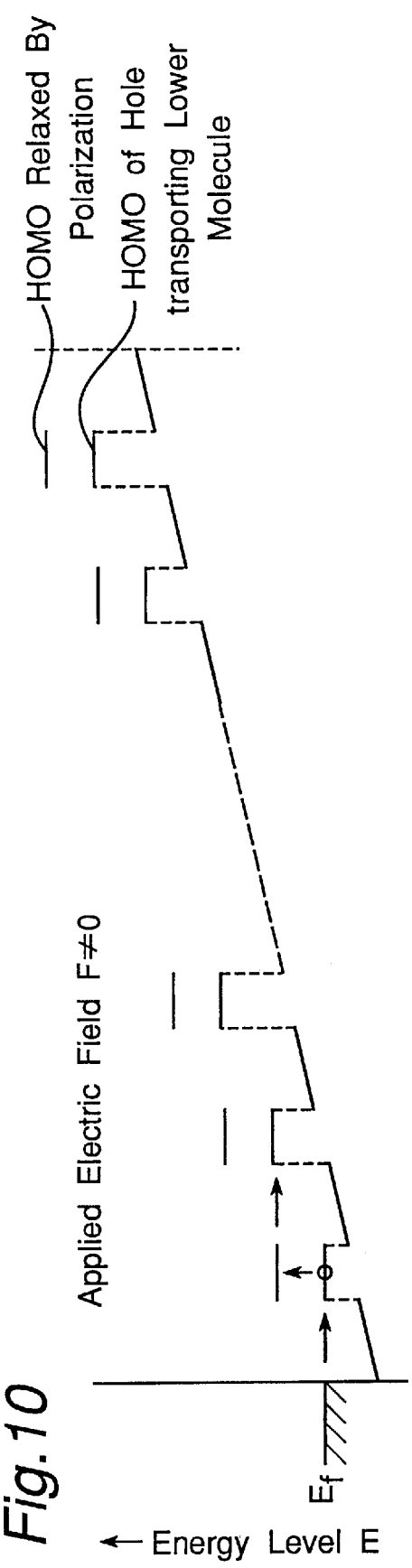
Fig.9 Principle of Operation of Negative Resistor Device By Tunneling Hole
Fig.10

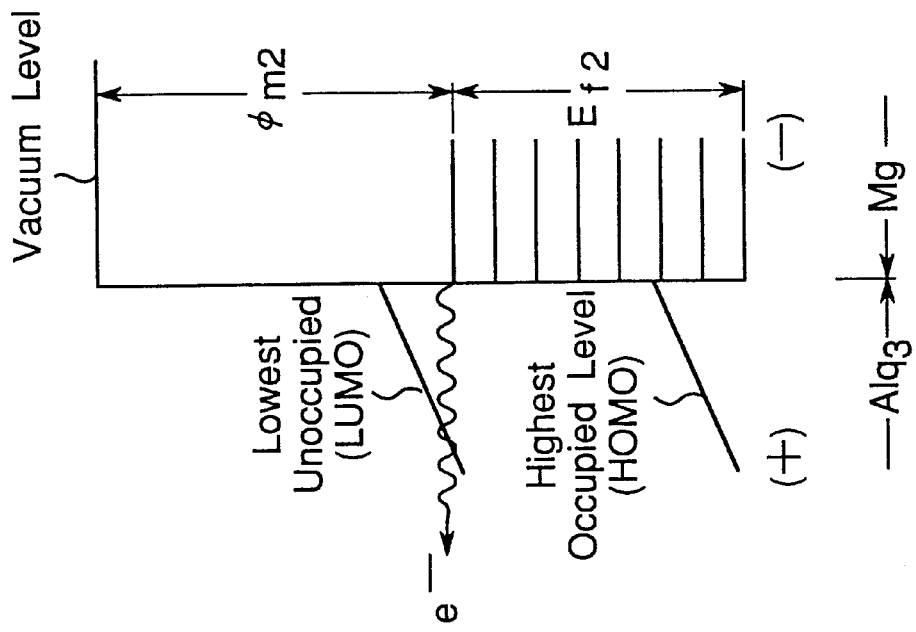
Fig. 12 Electron Injection
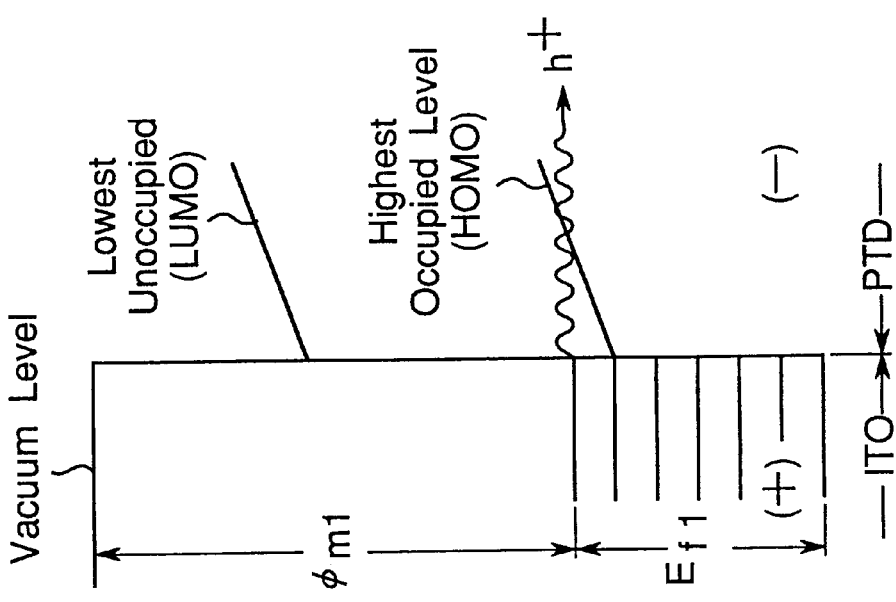
Fig. 11 At Time of Hole Injection

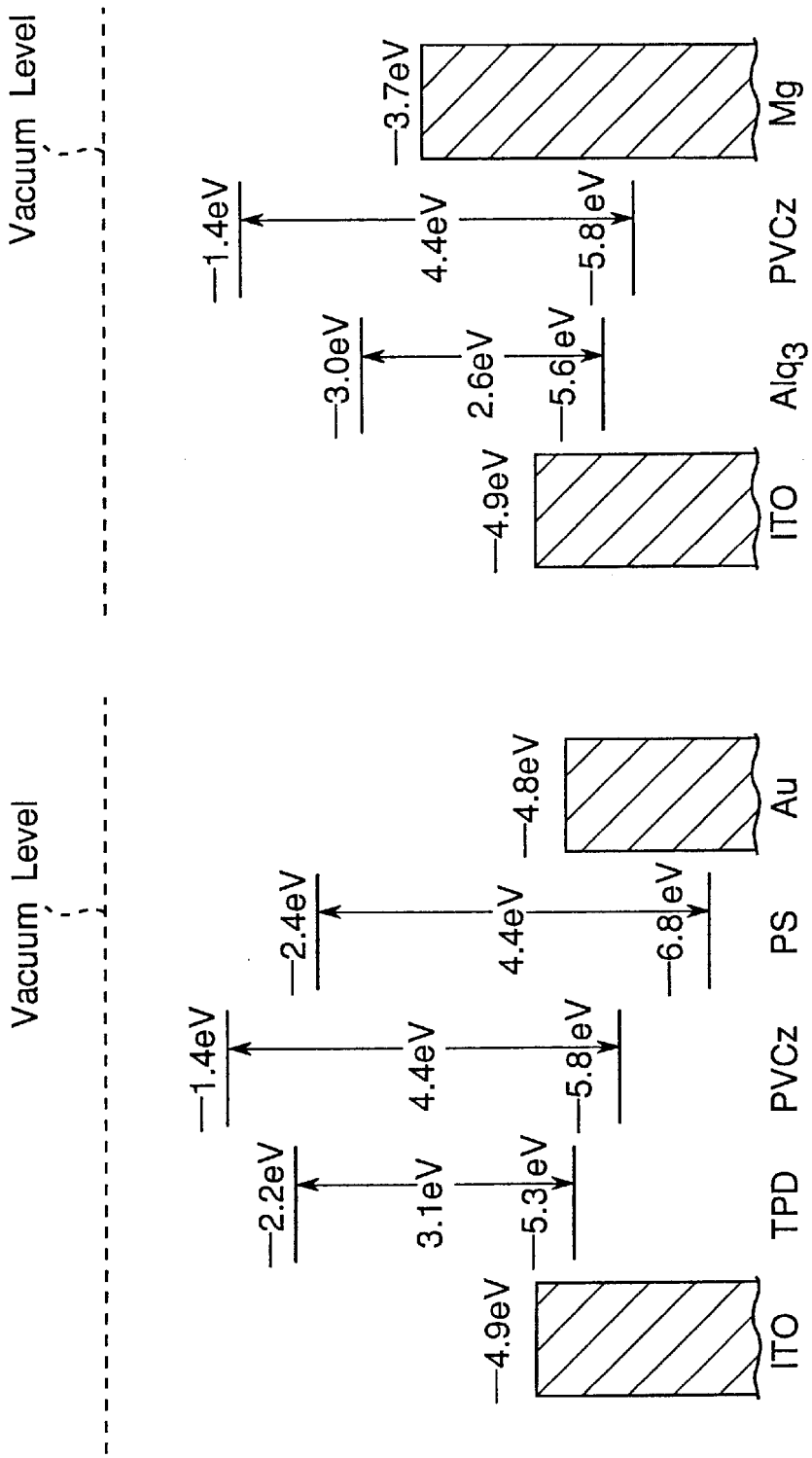
Fig. 13 Potential Barrier Against Hole
Fig. 14 Potential Barrier Against Electron

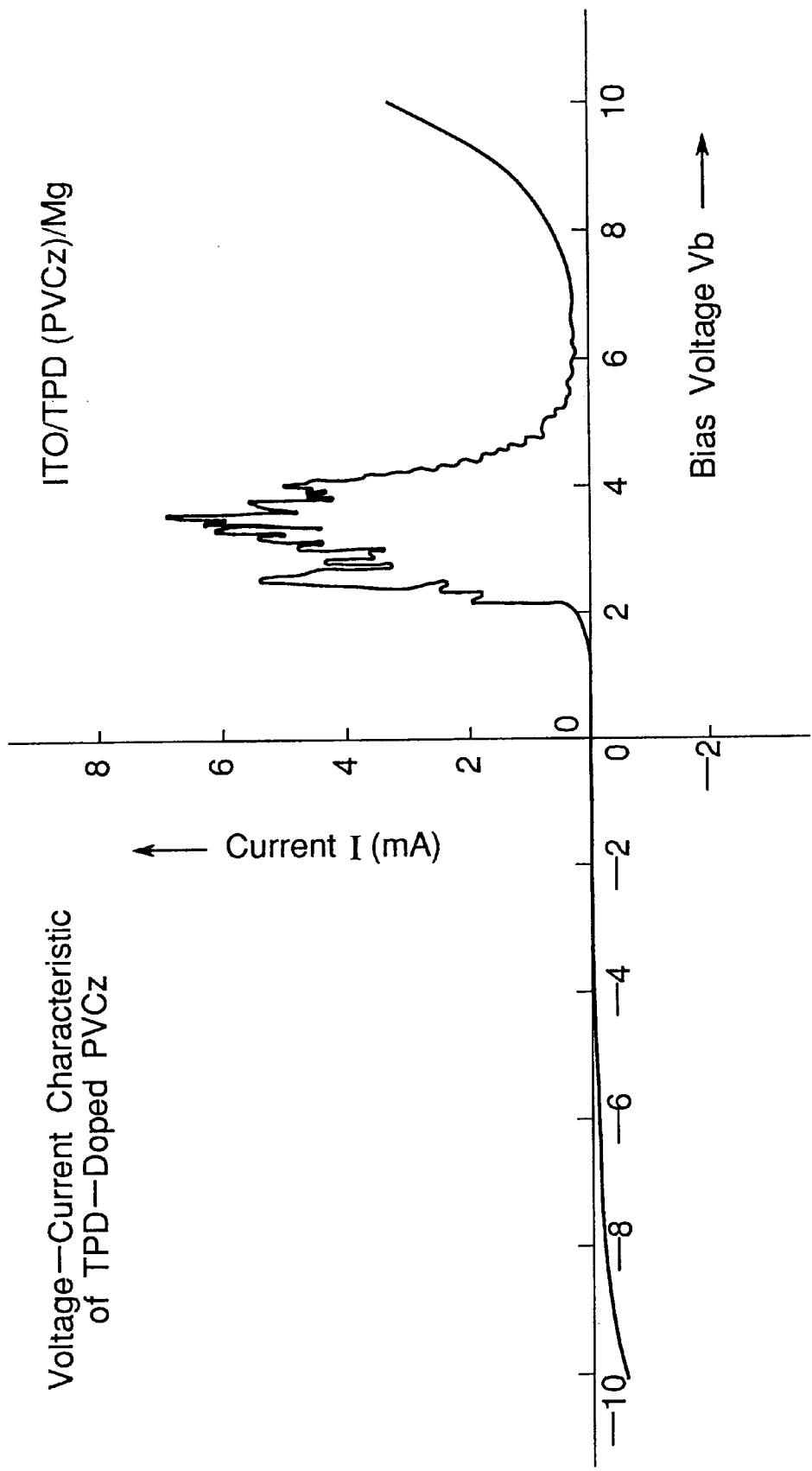
Fig.15 Voltage—Current Characteristic of TPD—Doped PVCz

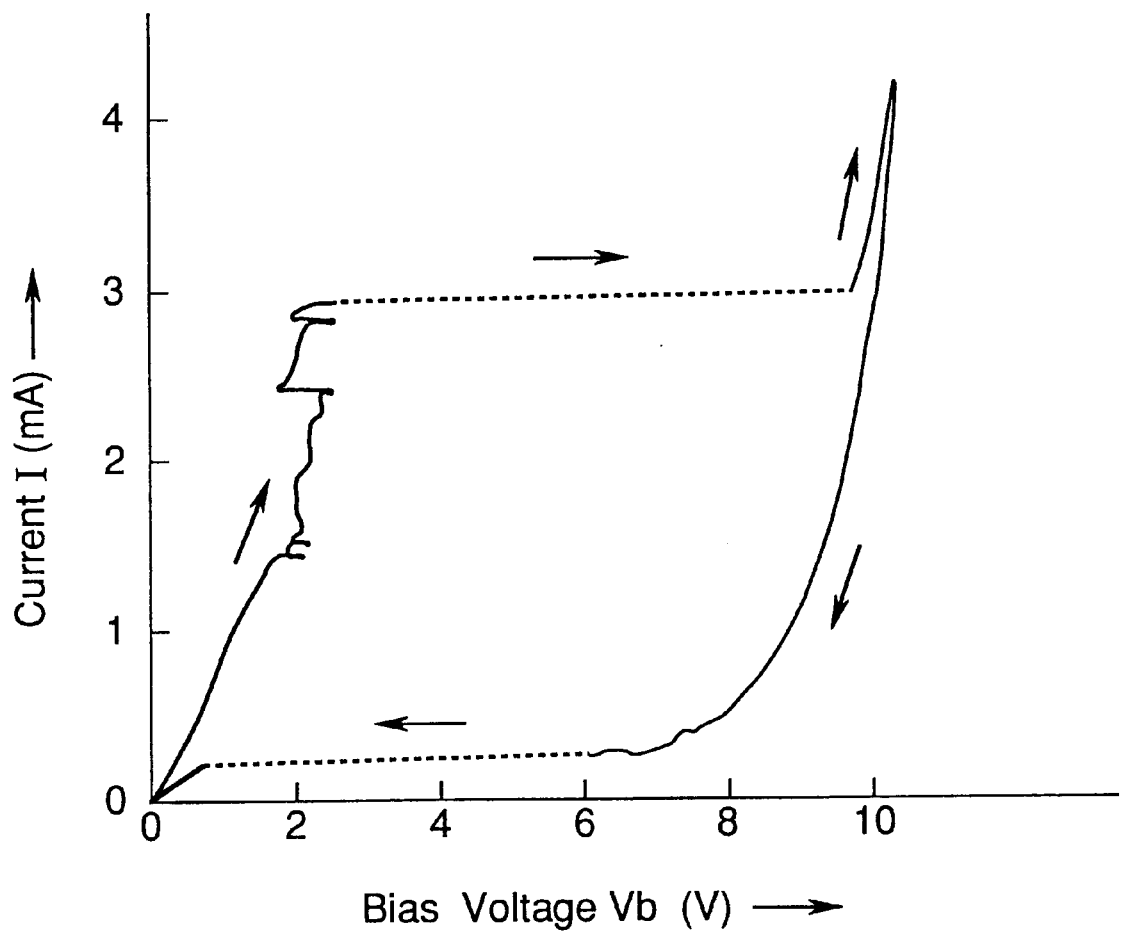

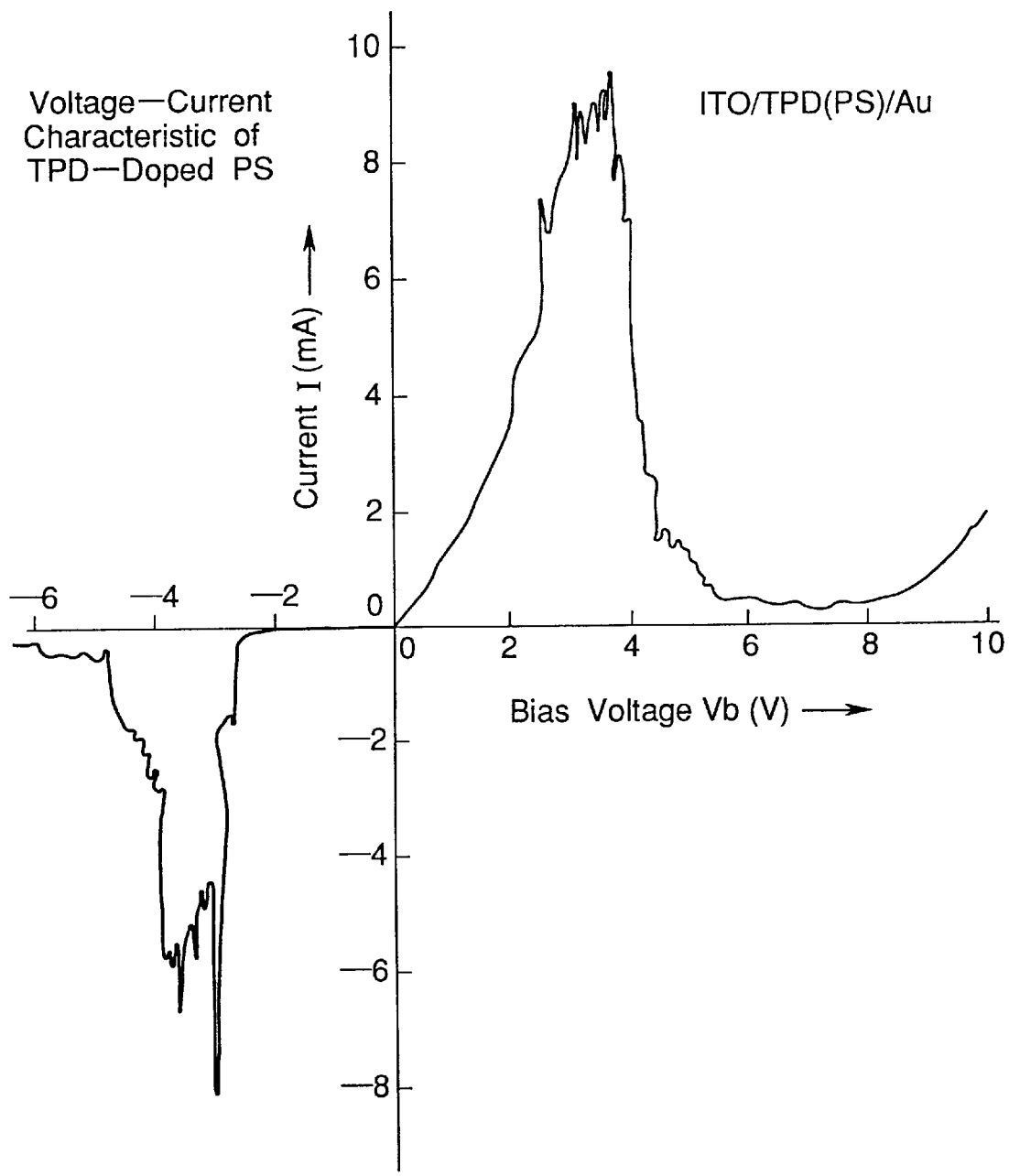

Fig. 18 Voltage–Current Characteristic of Alq$_3$–Doped PVCz
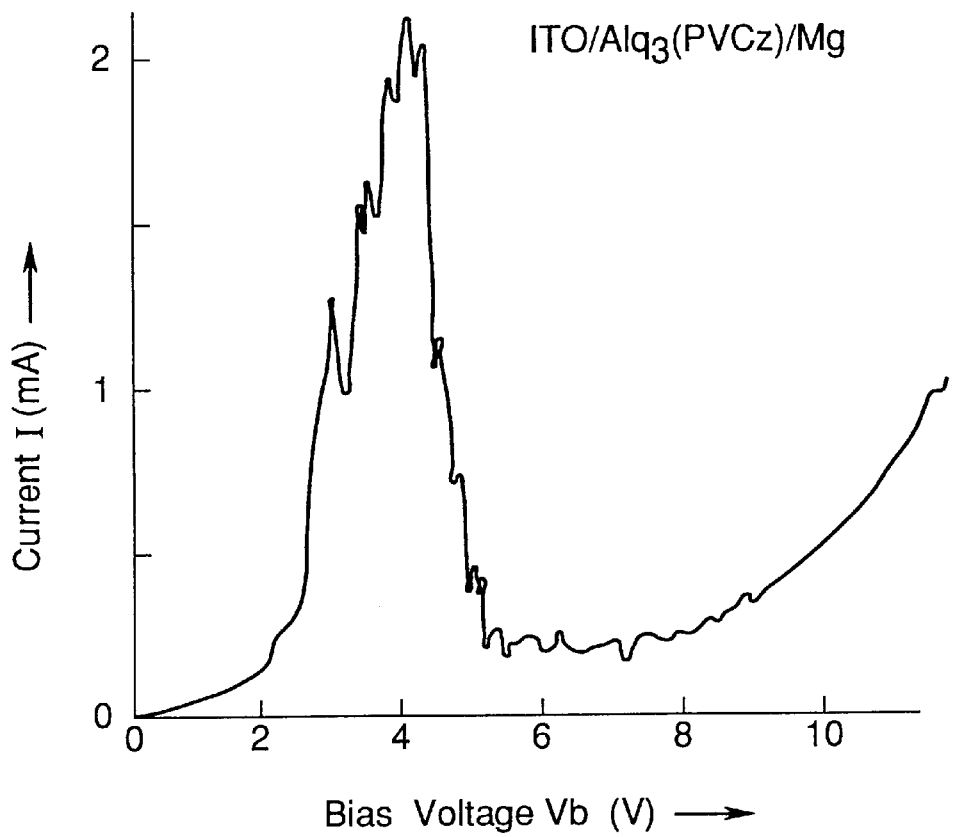
Fig. 19
Circuit Configuration of Tuning Type Oscillation Circuit
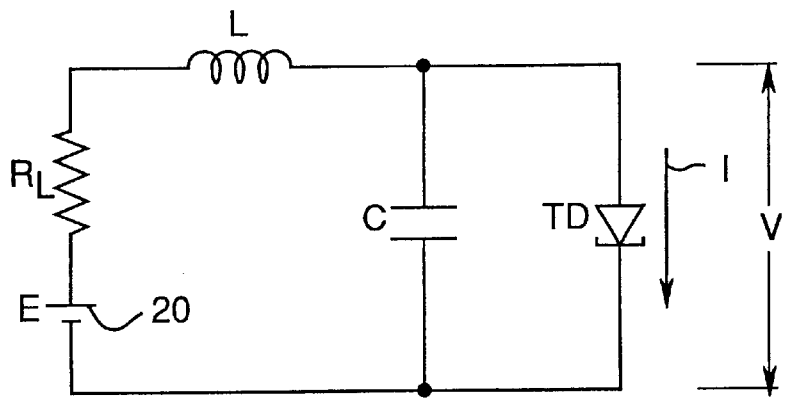

Equivalent Circuit of Tuning Type Oscillation Circuit

Operating Point and Oscillation Growth in Tuning Type Oscillation Circuit

Circuit Configuration of Pulse Generating Circuit   $I_i$: Trigger Pulse Current Operating Points and DC Load Line in Pulse Generating Circuit

MOLECULE-DOPED NEGATIVE-RESISTANCE DEVICE AND METHOD FOR MANUFACTURING THE SAME This application is the national phase under 35 U.S.C. §371 of prior PCT International Application No. PCT/JP97/01615 which has an International filing date of May 14, 1997, which designated the United States of America, the entire contents of which are hereby incorporated by reference.

TECHNICAL FIELD

The present invention relates to molecular-doped negative-resistance devices having a negative-resistance and switching and rectifying characteristics, in the field of organic molecular electronics, and a method for manufacturing the same. More particularly, the present invention relates to a molecular-doped negative-resistance device having a negative-resistance which is fabricated by using an electrically insulating organic polymer and a lower molecular organic compound, and a method for manufacturing the same.

BACKGROUND ART

Conventionally, as a negative-resistance device, there have been proposed various super lattice elements including those formed from single crystals of inorganic materials such as GaAs, AlAs and the like, and those formed from a combination of a single crystal of inorganic material and an inorganic amorphous material or electrically insulating organic polymer. Most of these are such that a thin film is formed by the molecular beam epitaxy technique (hereinafter referred to as an MBE process). This requires treatment under extremely severe conditions, such as ultra-high vacuum, high temperature conditions and the like and the use of a very costly and large-sized film forming apparatus. The process also requires strict control, and this makes it difficult to manufacture such a device uniform over a wide area. Further, semiconductors available for use are limited.

In the Japanese Patent Application Laid-Open Publication No. 6-29556, there is proposed a resonant tunneling diode having a negative-resistance characteristic which includes a fullerene thin film formed from a carbon cluster as an organic material and an electrically insulating thin film in which is used a metal oxide, the thin films being sandwiched between electrodes. This publication points out or suggests that an electrically insulating organic compound and an electrically insulating organic polymer matrix can be used as an electrically insulating layer. However, it is difficult to form an electrically insulating layer to the thickness of 3 to 15 nm, a thickness required for obtaining negative-resistance characteristics. In the publication, no example is shown of a tunnel diode in which the electrically insulating layer is formed from such electrically insulating organic materials.

Recently, an electroluminescence device having a quantum well structure formed by vacuum vapor depositing ultra-thin films of organic dyes alternately by an organic molecular beam evaporation method has been proposed in, for example, the prior art literature 1, Hiroshi Ohmori, et al, "Organic Quantum Well Structure EL Device", Monthly publication of The Japan Society of Applied Physics, Vol. 64, No. 3, pp. 246–249, 1995. However, the device has not demonstrated any negative-resistance characteristic.

In an operation at a room temperature, a negative-resistance device is required to exhibit a large ratio of peak current to valley current (the term "ratio of peak current to valley current" is hereinafter referred to as a "PV ratio"). However, the PV ratio of a resonant tunnel diode in which GaAs is used is about 7.7 at a temperature of 77 K (See, for example, prior art literature 2, Takayuki Nakagawa, et al, "Effect of Prewell Insertion in InGaAs/AlAs/InAs resonant tunneling diodes", Papers at Autumn General Meeting, 1995 of the Japan Society of Applied Physics Society, 29a-Zm-8, 1995).

On a junction interface of a negative-resistance device using an inorganic single crystal there exists a non-joinable surface level arising from dangling bonds which is characteristic of crystals. Development of such a surface level and degradation of crystallinity on the junction interface leads to lowering the interface electric field, thus lowering the efficiency of carrier injection with the result that the resonant-tunneling effect of the device is substantially affected.

A device comprising a combination of an electrically insulating organic polymer and an inorganic single crystal is inevitably thermally unstable and physically fragile because the thermal expansion coefficient of organic material is larger than that of inorganic material by about an order of magnitude. Inorganic single crystal materials are only available in limited kinds, i.e., GaAs and Si, and therefore negative-resistance devices using such materials permit only a lower freedom of material selection. Further, the prior art layer structure which comprises alternately stacked crystals of different compositions is complex in construction and is less processable. The MBE process which has hitherto been largely employed upon manufacturing the negative-resistance devices is such that crystal growth of component elements is carried out in ultra-high vacuum and under strict control. This poses the problem of lower productivity. Another problem is that the process requires a very costly film forming apparatus.

An object of the present invention is to provide a negative-resistance device which solves the above-mentioned problems, is easier to manufacture, can be manufactured at lower cost as compared with the prior art device, and yet has a comparatively large PV ratio, and a method for manufacturing the device.

DISCLOSURE OF THE INVENTION

A molecular-doped negative-resistance device according to the present invention comprises:

a molecular-doped layer made of an electron or hole transporting lower molecular organic compound, said molecular-doped layer being formed to be sandwiched between a pair of electrodes, wherein respective molecules of said electron or hole transporting lower molecular organic compound are isolated from one another by an electrically insulating organic polymer, wherein said molecular-doped negative-resistance device has a negative-resistance.

In the molecular-doped negative-resistance device, the molecular-doped layer has a multiple barrier type molecular doping structure, such that contacts each between the organic polymer and a molecule of the lower molecular organic compound are repeated in an alternate order of the organic polymer and the molecule of the lower molecular organic compound, by doping the lower molecular organic compound in the electrically insulating organic polymer.

Further, in the molecular-doped negative-resistance device, preferably the lower molecular organic compound is a triphenyldiamine derivative or 8-hydroxy-quinoline aluminum, and wherein the organic polymer is poly (N-vinylcarbazole) or polystyrene.

A method for manufacturing a molecular-doped negative-resistance device according to the present invention includes the following steps of:

forming a first electrode on a substrate;

doping an electronic carrier transporting lower molecular organic compound into an electrically insulating organic polymer, thereby forming a negative-resistance material having a multiple barrier type molecular doping structure such that contacts each between the organic polymer and a molecule of the lower molecular organic compound are repeated in an alternate order of the organic polymer and the molecule of the lower molecular organic compound;

forming a molecular-doped layer by forming said formed negative-resistance material on the first electrode using a dip coating method or spin coating method; and forming a second electrode on the molecular-doped layer.

In the method for manufacturing the molecular-doped negative-resistance device, the lower molecular organic compound is preferably a triphenyldiamine derivative or 8-hydroxy-quinoline aluminum, and the organic polymer is poly (N-vinylcarbazole) or polystyrene.

BRIEF DESCRIPTION OF THE DRAWINGS

FIG. 1 is a plan view showing a configuration of a molecular-doped negative-resistance device according to a preferred embodiment of the present invention;

FIG. 2 is a sectional view along a line A–A', showing a configuration of the molecular-doped negative-resistance device shown in FIG. 1;

FIG. 3 is a diagram showing a chemical structure of a triphenyldiamine derivative which is an organic molecular material used in the molecular-doped negative-resistance device shown in FIG. 1;

FIG. 4 is a diagram showing a chemical structure of a 8-hydroxy-quinoline aluminum complex ($Alq_3$) which is an organic molecular material used in the molecular-doped negative-resistance device shown in FIG. 1;

FIG. 5 is a view showing a chemical structure of polyvinyl carbazole ($PVC_Z$) which is an insulating organic material used in the molecular-doped negative-resistance device shown in FIG. 1;

FIG. 6 is a view showing a chemical structure of polystyrene (PS) which is an organic molecular material used in the molecular-doped negative-resistance device shown in FIG. 1;

FIG. 7 is an energy level diagram showing a principle of operation of a negative-resistance device by a tunneling transport of electrons in the molecular-doped negative-resistance device shown in FIG. 1 in the case of an applied electric field F=0;

FIG. 8 is an energy level diagram showing a principle of operation of a negative-resistance device by a tunneling transport of electrons in the molecular-doped negative-resistance device shown in FIG. 1 in the case of an applied electric field F≠0;

FIG. 9 is an energy level diagram showing a principle of operation of a negative-resistance device by a tunneling transport holes in the molecular-doped negative-resistance device shown in FIG. 1 in the case of an applied electric field F=0;

FIG. 10 is an energy level diagram showing a principle of operation of a negative-resistance device by a tunneling transport holes in the molecular-doped negative-resistance device shown in FIG. 1 in the case of an applied electric field F≠0;

FIG. 11 is an energy level diagram showing a process of tunnel injection from the electrodes in the molecular-doped negative-resistance device shown in FIG. 1 at the time of hole injection;

FIG. 12 is an energy level diagram showing a process of tunnel injection from the electrodes in the molecular-doped negative-resistance device shown in FIG. 1 at the time of electron injection;

FIG. 13 is an energy level diagram showing barrier heights of TPD, $PVC_Z$ and PS against holes in the molecular-doped negative-resistance device shown in FIG. 1;

FIG. 14 is an energy level diagram showing barrier heights of $Alq_3$ and $PVC_Z$ against electrons in the molecular-doped negative-resistance device shown in FIG. 1;

FIG. 15 is a graph showing Voltage-current characteristics of a molecular-doped negative-resistance device having a TPD-doped $PVC_Z$ layer according to a first example of the molecular-doped negative-resistance device shown in FIG. 1;

FIG. 16 is a graph showing switching characteristics of a molecular-doped negative-resistance device having a TPD-doped $PVC_Z$ layer according to the first example of the molecular-doped negative-resistance device shown in FIG. 1;

FIG. 17 is a graph showing Voltage-current characteristics of a molecular-doped negative-resistance device having a TPD-doped PS layer according to a second example of the molecular-doped negative-resistance device shown in FIG. 1;

FIG. 18 is a graph showing Voltage-current characteristics of a molecular-doped negative-resistance device having a $Alq_3$-doped $PVC_Z$ layer according to a third example of the molecular-doped negative-resistance device shown in FIG. 1;

FIG. 19 is a circuit diagram showing a circuit configuration of a tuning type of oscillator circuit as a first application example of the molecular-doped negative-resistance device shown in FIG. 1;

BEST MODE FOR CARRYING OUT THE INVENTION

Figure 20:
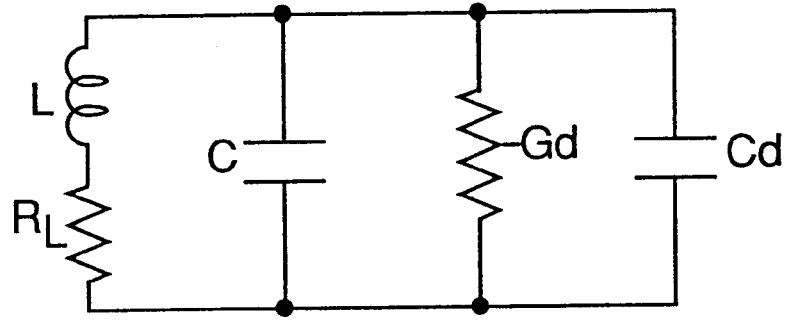
FIG. 20 is a circuit diagram showing a circuit equivalent to the tuning type of oscillator circuit shown in FIG. 19.

Preferred embodiments according to the present invention will now be described with reference to the accompanying drawings.

In order to thoroughly eliminate the foregoing deficiencies of the prior art negative-resistance devices, the inventor examined negative-resistance devices in which functions of organic molecules were utilized, that is, so-called molecular devices. As a result, it was found that, by doping a charge transferring lower molecular organic compound having a short molecular length into an electrically insulating organic polymer, there is formed a molecular doping structure comprising:

an electrically insulating organic polymer serving as a potential barrier; and a lower molecular organic compound having the lowest unoccupied level (hereinafter referred to as an LUMO) and the highest occupied level (hereinafter referred to as a HOMO), and that a device with the molecular doping structure formed to be sandwiched between two electrodes would exhibit negative-resistance characteristics. This led to he development of the present invention.

FIG. 1 is a plan view showing a configuration of a molecular-doped negative-resistance device according to a preferred embodiment of the present invention. FIG. 2 is a sectional view along the line A–A' which shows a construction of the molecular-doped resistance device shown in FIG. 1. The molecular-doped negative-resistance device embodying the present invention is manufactured in manner as described below.

As shown in FIG. 1, first of all, a first electrode or anode 2 is formed on a substrate 1 made of an electrically insulating substrate such as a glass substrate or the like, then an electronic carrier transporting lower molecular organic compound is doped into an electrically insulating organic polymer, this leads to that a negative-resistance material is formed which has a multiple barrier type molecular doping structure such that contacts each between the organic polymer and a molecule of the lower molecular organic compound are repeated in an alternate order of the organic polymer and the molecule of the lower molecular organic compound. Thereafter, the so formed negative-resistance material is coated on the anode 2 using the dip coating method or the spin coating method to thereby form a molecular-doped layer 3. Then, a second electrode or cathode 4 is formed on the molecular-doped layer 3. The positive pole of a bias DC power supply 10 is connected to the anode 2, while on the other hand the negative pole of the bias DC power supply 10 is connected to the cathode 4.

Thus, the molecular-doped negative-resistance device is formed which comprises a molecular-doped layer 3 such that a single molecule of a hole transporting or electron transporting lower molecular organic compound and an electrically insulating organic polymer are alternately repeated, the molecular-doped layer being formed so as to be sandwiched between two electrodes, i.e., the anode 2 and the cathode 4, in which the device has a negative-resistance. The molecular-doped layer 3 has a multiple barrier type molecular doping structure such that the lower molecular organic compound is doped in the electrically insulating organic polymer such that contacts each between the organic polymer and a molecule of the lower molecular organic compound are repeated in an alternate order of the organic polymer and the molecule of the lower molecular organic compound. In a preferred embodiment, the lower molecular organic compound is preferably a triphenyldiamine derivative (hereinafter referred to as TPD) or 8-hydroxy-quinoline aluminum (hereinafter referred to as Alq$_3$), and the organic polymer is preferably poly (N-vinylcarbazole) hereinafter referred to as a PVCZ) or polystyrene hereinafter referred to as a PS).

Therefore, the molecular-doped negative-resistance device embodying the present invention, unlike he conventional device of the kind, has a multiple barrier type molecular doping structure such that individual carrier-transporting molecules are isolated from one another by an electrically insulating material having a several nm order. The molecular doping structure is formed by doping the hole transporting or electron transporting lower molecular organic compound, such as triphenyldiamine derivative (TPD), 8-hydroxy-quinoline aluminum (Alq$_3$) or the like, into a polymer matrix, that is, an electrically insulating organic polymer, such as poly (N-vinylcarbazole) (PVCz), polystyrene (PS), or the like, and the intermolecular distance in the lower molecular organic compound is changed by changing the dopant concentration. The structure can be a super lattice structure depending upon the manner of arrangement of molecules of the lower molecular organic compound. A polymer thin film having such lower molecular organic compound doped therein (hereinafter referred to as molecular-doped polymer thin film, which expression is generalized so that a B thin film having A doped therein is called "A-doped B thin film") is formed so as to be sandwiched between a metal of the anode 2 having a large work function and a metal of a cathode having a small work function or the cathode 4 having a large work function. This results in formation of the molecular- doped negative-resistance device having a negative-resistance.

The molecular-doped polymer thin film of the molecular-doped layer 3 is formed on a vacuum vapor deposited anode substrate using the dip coating method or the spin coating method, with a dispersion liquid formed such that the electronic carrier transporting lower molecular organic compound and the electrically insulating organic polymer material are dissolved in an organic solvent. Then the organic polymer thin film in which the lower molecular organic compound is doped is formed between the metal of the anode 2 having a large work function, such as ITO, Au or the like, and the metal of the cathode 4 having a small work function, such as Mg, Al or the like. Thus, the molecular-doped negative-resistance device of a negative-resistance tunneling device is obtained.

The molecular-doped resistance device of the preferred embodiment is different from the conventional resonant tunneling diodes in that the negative-resistance thereof is obtained by virtue of the tunnel effect at the interface between the electrode metal and the lower molecular organic compound and of the phenomenon of polarization as developed by electrons trapped in lower molecular LUMO or holes trapped in HOMO. A hole that is tunnel-injected from the anode 2 into HOMO of the lower molecular organic compound tunnel-electrically-conducts across the lower molecular organic compounds doped in the organic polymer. That is, when the hole injected from the anode 2 is trapped in a lower molecular HOMO, the hole polarizes the surroundings with its electric field. The hole-trapped HOMO (hereinafter referred to as an occupied HOMO) loses the energy due to the polarization and its energy level is lowered. On the other hand, when a HOMO adjacent to an occupied HOMO (hereinafter referred to as an empty HOMO) is made to have the same level as that of the occupied HOMO by an external electric field, the hole tunnels the electrically insulating polymer between lower molecules. As the external electric field increases, an empty HOMO adjacent to an electrode interface gets close to the Fermi level of the electrode metal, and when an occupied HOMO in the bulk approaches the level of the empty HOMO, there occurs a current increase. When the occupied HOMO goes away from that level, the current decreases. Thus, a so-called negative-resistance is produced. Where the electron transporting organic compound is doped in the electrically insulating organic polymer, an electron tunnel-injected from the cathode 4 tunnel-electrically-conducts across the lower molecular organic compound dope. The electronic carrier that passes through the electrically insulating polymer to electrically conduct across the doped lower molecular organic compounds may be an electron or hole. It is noted in this connection that the process of tunnel-injecting the hole and electron from the anode 2 or the cathode 4 is not dependent upon the temperature. However, the potential barrier is dependent upon the energy level difference between the electrode material and the lower molecular organic compound.

The electrically insulating organic polymer used in the molecular-doped negative-resistance device of the present preferred embodiment may be any such material as PVCz or PS which is soluble in an organic solvent such as chloroform, 2-dichloroethane or the like. On the other hand, for the lower molecular organic compound, any hole transporting or electron transporting material, such as TPD, $Alq_3$ or the like, which has a molecular length of an order of 2 nm may be used as long as it is soluble in organic solvents. The concentration of the molecular doping or dispersion is preferably so determined as to give an average distance between molecules of the order of 2 nm. There are many kinds of organic materials usable in the molecular-doped negative-resistance device of the present preferred embodiment, and this affords great freedom of material selection. In fact, however, in order to obtain a satisfactory combination of an electrically insulating organic polymer and a carrier transporting lower molecular organic compound, it is necessary to prepare energy band diagrams for respective materials.

In order to obtain a greater PV ratio, any thermal current component resulting from other than tunneling should be decreased. For this purpose, a material combination is selected which can produce a larger difference in the HOMO or the LUMO between the electrically insulating organic polymer and the carrier transporting lower molecular organic compound to thereby provide an increased potential barrier height. In this case, it may be mentioned that the device of the present preferred embodiment manufactured by the inventor had a PV ratio of more than 30 when operated at a room temperature. When the difference in work function between electrode materials for the anode 2 and the cathode 4 is increased, rectifying characteristics are created. However, when the electrode materials for the electrode 2 and the cathode 4 are made to have the same level of the work function, no rectifying characteristic could be obtained, and peaks/valleys will appear in the voltage-current characteristics for both the forward and reverse directions.

Since the electronic carrier-transporting lower molecular organic compounds and the electrically insulating organic polymers have enclosed structures, there is almost no surface level. Further, since the molecular-doped negative-resistance device of the present invention is totally constructed of organic material, individual molecules involve no difference in thermal expansion coefficient and the device is therefore thermally stable. In addition, because of the fact that the polymer matrix is an organic polymer material, the device has a high mechanical strength.

The molecular-doped negative-resistance device of the present preferred embodiment does not require any process of alternately laminating crystals of different compositions upon one another in an ultra-high vacuum state, and is therefore very simple in construction, well adaptable for finer size reduction, and has good workability. Further, the device does not require the use of ultra-high vacuum as used in the MBE method, or of a vacuum vessel or organic gas as used in the MOCVD method, nor does it require the use of a costly film forming apparatus. In addition, since the device is a single device, the device requires formation of doped polymer films and electrodes only. Thus, the molecular-doped negative-resistance device offers an exceptional advantage that it can be manufactured at very lower cost.

EXAMPLES

First Example

As shown in FIGS. 1 and 2, an anode 2 made of ITO (indium tin oxide) is formed on a glass substrate 1, then a TPD-doped PVCz thin film which defines a molecular-doped layer 3 is formed on the anode 2, and then a Mg layer for the cathode 4 is vacuum deposited on the molecular-doped layer 3. The TPD used in the molecular-doped layer 3 is an amorphous, hole transporting organic compound, and PVCz is an amorphous, electrically insulating organic polymer. FIGS. 3 and 5 respectively show molecular structures of TPD and PVCz used in the present example.

FIGS. 7, 8, 9 and 10, each show the principle of operation of a molecular-doped negative-resistance device having a negative-resistance, and FIGS. 11 and 12 respectively show the process of tunnel injecting an electronic carrier from the anode 2 and that from the cathode 4. In this conjunction, reference is made to FIG. 11 which is a diagram showing an energy level at the time when positive bias voltage is applied to the device, between the ITO electrode as the anode 2 and the Mg electrode as the cathode 4.

As shown in FIG. 11, a hole is tunnel-injected at room temperature from a spot adjacent the Fermi level of ITO into a TPD molecule within the molecular-doped layer 3 of TPD-doped PVCz. As shown in FIG. 9, the electric conductivity of TPD is higher than the electric conductivity of PVCz. Therefore, the potential gradient of TPD is lower than that of PVCZ. The hole tunnel-injected from the anode 2 of an ITO electrode into TPD polarizes the surrounding thereof. As a result, the energy level of an occupied HOMO becomes deeper, and the hole tunnels to an empty HOMO which comes close thereto by an external electric field. When an applied voltage reaches 3.5 V, the Fermi level of the ITO electrode and the level of the empty HOMO become even, and also the occupied HOMO and the empty HOMO become equal in the level, this leads to a large current peak.

FIGS. 13 and 14 are energy band diagrams for reading energy level differences between constituent materials of various negative-resistance devices shown in examples of the present invention. In the present example, the height of a barrier against hole injection between PVCz and TPD is about 0.5 eV.

Next, the method for manufacturing the molecular-doped negative-resistance device in the present example of the present invention is described hereinbelow. On the anode 2 of an ITO electrode having a thickness of about 150 nm vapor-deposited by spattering on glass substrate 1 of FIG. 1, a TPD molecule-doped thin film of PVCz is formed by means of the dip coating technique to the thickness of about 50 nm. Then, the thin film is dried with a solvent saturated vapor pressure so that any pin hole formation in the thin film can be prevented. Then, the cathode metal 4, namely, Mg having a thickness of 50 nm and Ag having a thickness of 200 nm are vapor deposited by vacuum spraying in an order of Mg and Ag, and the device is completed. The vapor deposition of Ag is intended to prevent oxidation of Mg. Where Mg and Ag are vapor co-deposited, the antideterioration characteristics of the device can be further enhanced. The thickness of each layer was measured by means of an ellipsometer. The doping concentration of TPD in the present example is about 29 wt % relative to the polymer matrix, i.e., PVCz, the average distance between molecules is about 0.91 nm, and the molecular length of TPD is 1.8 nm to the maximum. The formation of above described thin film for molecular-doped layer 3 may be carried out by the spin coating technique. The concentration of the dopant is not limited to 29 wt %.

The DC voltages changing from 0 V to +10 V were applied to the device at a room temperature (scan speed: 20 mV/sec), and negative-resistance (or negative electric conductance) characteristics were obtained in the forward voltage-current characteristics shown in FIG. 15. As the bias voltage was increased, the current also increased at a voltage level of about 1 V and higher until the maximum value was reached at about 3.5 V. This peak current density was about 150 mA/cm$^2$. Subsequently, it was observed that the current decreased due to negative-resistance and then began to increase at a voltage level close to 7 V. The difference between the peak voltage and the valley voltage was larger than that of an Esaki diode by about order of magnitude. The reverse current was comparatively small, say, on an order of 1 $\mu$A/cm$^2$. When the voltage level was ±6 V, good rectification characteristic was showed with a rectification ratio of 300. The device exhibited very good reproducibility with respect to these voltage-current characteristics. The material of the anode 2 in the present instance is not limited to ITO, and any other material is acceptable as long as value of its work function is close to that of the HOMO of TPD. For example, such other material may be Au, Ag or C. The material of the cathode 4 is not limited to Mg, and any other material is acceptable if its work function value is substantially different from that of LUMO of TPD. For example, such other material may be Al, Li, or a Mg—Ag or Al—Li alloy having high chemical stability.

Next, the switching characteristics of the device when current driven are shown in FIG. 16. When the drive current is increased from zero, a voltage of about 2 V is generated at 75 mA/cm$^2$. When the current is further increased, a voltage of about 9 V is suddenly generated at a similar current density. Conversely, as the drive current is decreased, the voltage level goes back to zero volt straight from 6 V or so. As may be apparent from the switching characteristics illustrated in FIG. 16, the device provides hysteresis characteristics.

Second Example

While the description of the first example concerns the case in which the electrically insulating organic polymer used is PVCz (poly (N-vinylcarbazole)), amorphous PS (polystyrene) may be used instead of PVCz to give the same negative-resistance characteristics in a manner similar to that in the case where PVCz is used. In the present example, the construction of the device is such that in the construction shown in FIG. 1, the anode 2 is made of ITO; the moleculardoped layer 3 is made of a TPD-doped PS, and the cathode 4 is made of Au. TPD of the molecular-doped layer 3 is a hole transporting amorphous material, and it is doped in PS (polystyrene) of an electrically insulating material, then a multiple barrier type molecular doping structure is formed. FIGS. 3 and 6 respectively show molecular structures of TPD and PS used in the present example.

Where a hole transporting lower molecular-doped polymer thin film is sandwiched between electrode materials each having a large work function, such as ITO, Au or the like, peaks/valleys, that is, a negative-resistance is observed also in the reverse direction as shown in FIG. 17. The wave form of reverse current is smaller because the work function of Au is smaller than the work function of ITO, and because the quantity of hole injection from the electrode is smaller.

FIG. 11 is a diagram showing an energy level at the time when a positive bias voltage is applied to the device between the anode 2 of an ITO electrode, and the cathode 4 of an Au electrode. FIG. 11 illustrates holes being tunnel-injected from Fermi level or adjacent level of ITO into TPD of the TPD-doped PS. As is apparent from FIGS. 9 and 10, the electric conductivity of TPD is higher than that of PS and, therefore, the potential gradient of TPD is lower than that of PS. A hole tunnel-injected from the anode 2 of the ITO electrode into TPD polarizes its surroundings. As a result, the energy level of the occupied HOMO becomes deeper, and the hole tunnels into an empty HOMO which has approached under the influence of an external electric field. As the applied voltage increases to 3.6 V, the Fermi level of ITO and the level of the empty HOMO, as also the level of an occupied HOMO and the level of the empty HOMO, become even with each other, and thus there occurs a large current peak. According to the energy band diagrams for ITO, TPD, PS and Au shown in FIGS. 13 and 14, the barrier height between PS and TPD against hole injection is about 1.5 eV, and PV ratio is about 30.

The method for manufacturing the device shown in the present example is as follows. A TPD-doped PS thin film is formed to a thickness of about 50 nm by the dip coating technique on the anode 2 of the ITO electrode of about 150 nm in thickness which is vapor deposited by spattering on a glass substrate shown in FIG. 1. Then, the thin film is dried under a saturated solvent vapor pressure so that pinhole formation in the thin film can be prevented. Thereafter, cathode metal 4 or Au (50 nm thick) is vacuum vapor deposited on the thin film to complete the manufacturing of the device. In the present example, the doping concentration of TPD is about 29 wt % relative to the PS, i.e., the binder, average distance between molecules is about 0.94 nm, and the molecular length of TDP is 1.8 nm, maximum. Manufacturing of the thin film may be carried out by spin coating. It is to be noted that the dopant concentration is not limited to 29 wt %.

The DC voltage charging from 0 V to +10 V was applied to the device (scan speed: 20 mV/sec) at room temperature. As a result, negative-resistance (or negative electric conductance) characteristics were exhibited in the forward voltage-current characteristics shown in FIG. 17. As bias voltage increased, electric current began to increase in the vicinity of 0 V and reached a maximum value in the vicinity of 3.6 V. The peak current density was about 225 mA/cm$^2$. Subsequently, it was found that the current decreased due to the negative-resistance and began to increase in the vicinity of 7 V. The difference between the peak voltage and the valley voltage was more than 2 V. The reproducibility of the voltage-current characteristics was very satisfactory. As may be seen from the present example, where the lower molecular organic compound doped in the organic polymer is a hole transporting material and where a HOMO of the compound is close to the work functions of the anode and cathode, negative-resistance will occur in both forward and reverse directions. Such negative-resistance in both directions will also occur in the case where the lower molecular organic compound doped in the organic polymer is an electron transporting material and where a LUMO of the compound is close the work functions of the anode and cathode.

Third Example

The construction of the device in the present example is such that in FIG. 1 the anode 2 is made of ITO, the molecular-doped layer 3 is made of $Alq_3$-doped PVCz, and the cathode 4 is made of Mg/Ag. The $Alq_3$ (8-hydroxyquinoline aluminum) in the molecular-doped layer 3 is an electron transporting amorphous material such that a multiple barrier type molecular doping structure is formed by doping the material in the PVCz (poly (N-vinylcarbazole)), an electrically insulating material. FIG. 4 shows a molecular structure of $Alq_3$ used in the present example.

FIG. 12 is an energy level diagram which shows the energy level at the time when negative bias voltage is applied to the device between the cathode 4 of an Mg electrode, and the anode 2 of an ITO electrode, electrons being tunnel-injected into the $Alq_3$ of the $Alq_3$-doped PVCz from the Fermi level or an adjacent level of the Mg electrode. As shown in FIGS. 7 and 8, the electric conductivity of $Alq_3$ is higher than the electric conductivity of PVCz and, therefore, the potential gradient of $Alq_3$ is lower than that of PVCz. Each electron which is tunnel-injected from the Mg electrode of the cathode 4 into $Alq_3$ polarizes the surroundings of the $Alq_3$. As a result, the level of the occupied LUMO which has trapped an electron becomes deeper, and the electron tunnels into an empty LUMO which has approached under the influence of an external electric field. As the applied voltage increases to 4 V, the Fermi level of Mg and the level of the empty LUMO, as also the level of an occupied LUMO and the level of the empty LUMO, become even with each other, and thus there occurs a large current peak. FIGS. 13 and 14 are energy band diagrams for ITO, $Alq_3$, PVCz, and Mg. The barrier height between PVCz and $Alq_3$ against electron injection is about 1.6 eV, and PV ratio is about 11.

The method for manufacturing the device shown in the present example is as follows. An $Alq_3$ molecule-doped PVCz thin film is formed to a thickness of about 50 nm by the dip coating technique on an ITO electrode of anode 2 of about 150 nm in thickness which is vapor deposited by spattering on a glass substrate shown in FIG. 1. Then, the thin film is dried under a saturated solvent vapor pressure so that pinhole formation in the thin film can be prevented. Thereafter, cathode metals 4, that is, Mg (50 nm thick) and Ag (200 nm thick), are vacuum vapor deposited on the thin film to complete the device as such. In case that Mg and Ag are co-deposited, the device can have improved resistance to deterioration. In the present example, the doping concentration of $Alq_3$ is about 29 wt % relative to the $Alq_3$ content of the polymer matrix, average distance between molecules is about 1.01 nm, and the molecular length of $Alq_3$ is 0.75 nm, maximum. Manufacturing of the thin film may be carried out by spin coating.

The DC voltage charging from 0 V to +12 V was applied to the device (scan speed: 20 mV/sec) at room temperature. As a result, negative-resistance (or negative electric conductance) characteristics were exhibited in the forward voltage-current characteristics shown in FIG. 18. As bias voltage increased, electric current began to increase in the vicinity of 0 V and reached a maximum value in the vicinity of 4 V. The peak current density was about 50 $mA/cm^2$. Subsequently, it was found that the current decreased due to the negative-resistance and began to increase in the vicinity of 7 V. The difference between the peak voltage and the valley voltage was more than 2 V. The reproducibility of the voltage-current characteristics was very satisfactory. Where the material of the anode 2 in this example is smaller in work function than HOMO of $Alq_3$ and where the difference is substantial, the anode material is not limited to ITO and may be Al or Cu, for example. Where the material of the cathode 4 is close to LUMO of $Alq_3$ in work function, the material is not limited to Mg, and may be, for example, Al, Li, or chemically highly stable Mg—Ag alloy or Li—Al alloy.

Although poly (N-vinylcarbazole) and polystyrene were used as polymer matrix in the foregoing examples, other materials may be used as such without limitation if the material is an organic polymer material which is soluble in organic solvents, well compatible with lower molecular organic compounds, and does not adversely affect the mobility of electronic carriers. For example, preferred polymer materials include polycarbonate (PC), polyvinyl chloride (PVC), polyether sulfone (PES), and polymethyl methacrylate (PMMA). The lower molecular organic compounds are not limited to TPD and $Alq_3$ as long as the compound has a molecular length of nm order and carrier transporting capability. As examples of hole transporting materials may be mentioned organic dye molecule, such as triphenylamine derivative (TPA), quinacridone (QA), diamine derivative (NSD), bis-triphenylaminestil derivative (BTAS), butadiene derivative (DEAB), pentaphenyl cyclopen (PPCP), and distyryl biphenyl derivative (DPVBi). Examples of electron transporting materials include organic dye molecule, such as styryl derivative (ST-1), 9, 10-bis-styryl anthracene derivative (BSA), oxadiazole derivative (OXD), distyryl benzene derivative (DSB), perylene derivative (PV), and 1, 2, 4-triazole derivative (TAZ); and quinolinol-based metal complexes, such as Be-benzoquinolinol complex ($Beq_2$), and gallium 8-quinolate (GaQ).

Doping of lower molecules into the polymer may be carried out without using a solvent, say, by employing a dry method, such as a vacuum vapor deposition method or an ionized vapor deposition method of, for example, poly (N-vinylcarbazole).

First Application Example

Figure 21:
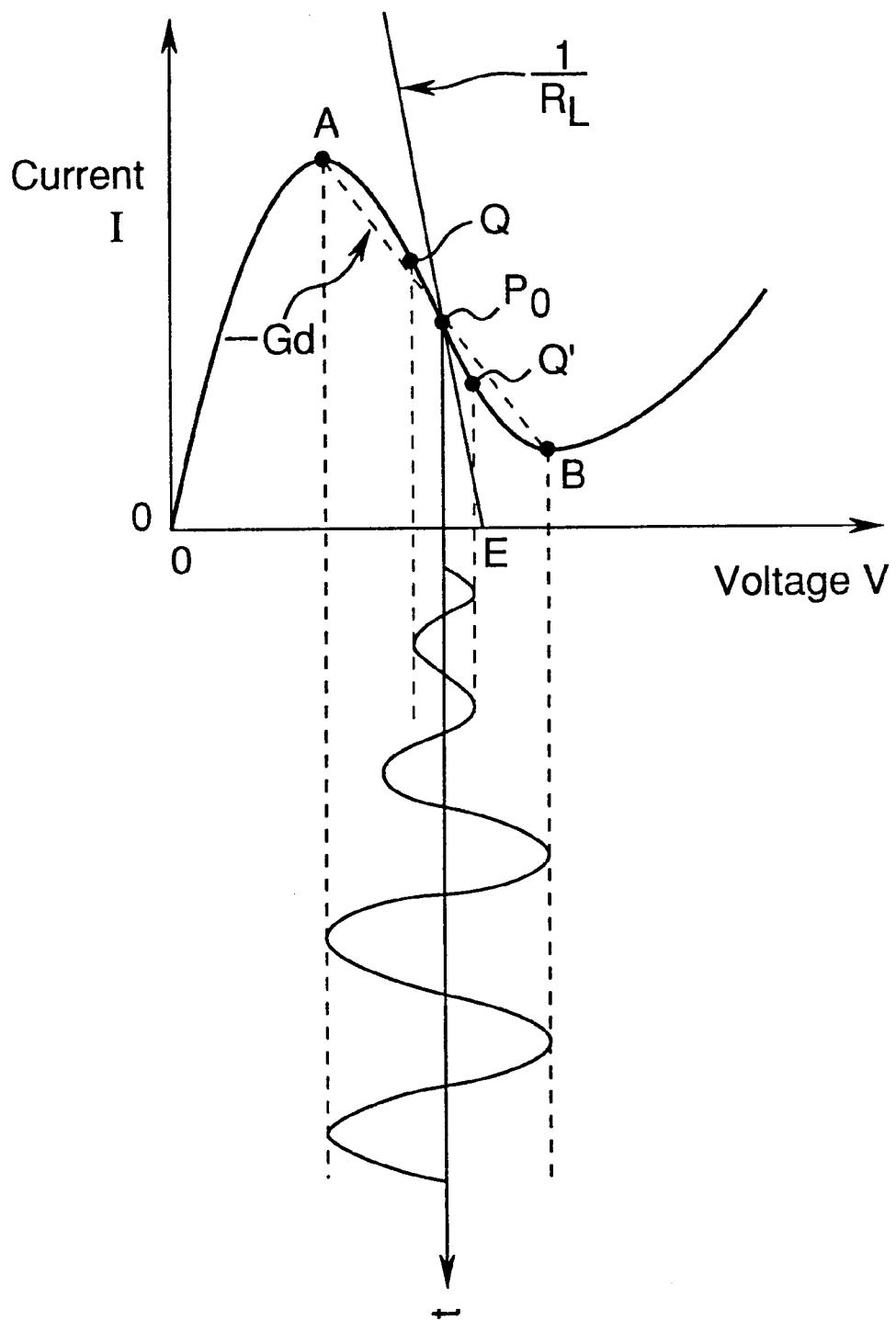
FIG. 21 is a graph showing operating points and oscillation growth of the tuning type of oscillation circuit shown in FIG. 19.

FIG. 19 is a circuit diagram showing a circuit configuration of a tuning oscillation circuit as a first application example of the molecular-doped resistance device shown in FIG. 1, and FIG. 20 is a circuit diagram showing an equivalent circuit. FIG. 21 is a graph showing an operating point and oscillatory growth in the tuning oscillation circuit.

In FIG. 19, a capacitor C is connected in parallel with the molecular-doped resistance device TD, and further, the capacitor, an inductor L, a load resistance $R_L$, and a DC bias supply 20 are connected in series, then the tuning oscillation circuit is formed. In the equivalent circuit shown in FIG. 20, the molecular-doped negative-resistance device TD may be depicted as a parallel circuit of a negative electric conductance $-Gd$ and a capacitor Cd.

In the first application example, in order to make an oscillation, it is necessary that the circuit must have an operating point at $P_0$. in the negative-resistance (or negative electric conductance) region, and that the load resistance $R_L$ be $1/R_L > |Gd|$, that is, $R_L < 1/|Gd|$ as shown in FIG. 21. The reason for this is that if $1/R_L < |Gd|$, three operating points exist so that the oscillated signal is clamped so as to prevent any oscillation operation. Therefore, as illustrated in FIG. 19, a parallel resonant circuit configuration is employed such that the load resistance $R_L$ is connected in series to the inductor L, with the molecular-doped resistance device TD connected in series to the capacitor C connected as above said. In FIG. 20, the equivalent circuit is illustrated in such a way that the series resistance of the molecular-doped negative-resistance device TD is disregarded. The equivalent circuit for the molecular-doped negative-resistance device TD is shown as a parallel circuit of Cd (barrier capacitance) and −Gd (gradient of straight line AB). When the supply voltage E is applied to the parallel resonance circuit so that the LC oscillator using the molecular-doped negative-resistance device TD can operate in the negative-resistance region, oscillation conditions are as follows:

$$-Gd + j\omega(C + Cd) + 1/(R_L + j\omega L) = 0 \quad (1)$$

In the above equation (1), the following equation (2) is used.

$$Q = (\omega L)/R_L \quad (2)$$

$$1/(R_L + j\omega L) = 1/R + 1/j\omega L' \quad (3)$$

Where Q>1, the following equation is obtained.

$$R = R_L(1 + Q^2) \approx R_L Q^2 \quad (4)$$

$$L' = L(1 + 1/Q^2) \approx L \quad (5)$$

For oscillation conditions, the following equation is obtained from above equations (1) through (5).

$$\omega = 1/(L'(C + Cd))^{1/2} \quad (6)$$

$$R > 1/|Gd| \quad (7)$$

Therefore, oscillating frequency f and power conditions are respectively expressed by the following equations.

$$f = (\tfrac{1}{2})\pi(L(C + Cd))^{1/2} \quad (8)$$

$$R_L \leq |Gd|L/(C + Cd) \quad (9)$$

In the above equation (9), the condition "$R_L = L|Gd|/(C + Cd)$" is ideal for use as a power condition. In practice, however, the condition is set to "$R_L < |Gd|L/(C + Cd)$".

Next, an oscillating operation will be explained with reference to FIG. 21. At the initial stage of oscillation, the absolute value of gradient Gd' (gradient of straight line QQ') in the characteristic curve is larger than the conductance $1/R_L$ of the resonance circuit, and the quantity of supply energy is larger than the quantity of lost energy. Therefore, the oscillation tends to grow. Thereafter, as the swing ranges of voltage and current become larger, the value of Gd' gradually tends to become smaller. When the swing on the characteristic curve tends to occur in the range of A to B, the gradient of the characteristic curve is Gd (gradient of straight line AB).

When the absolute value of the gradient Gd becomes just equal to $1/R_L$, the lost energy and the supplied energy are balanced so that the amplitude of the swing becomes constant, resulting in a stationary state. The amplitude of the oscillation amplitude is determined by the voltage range between the peak voltage and the valley voltage in the negative-resistance region shown in FIG. 21. The oscillation amplitude of the device is about 2 V, which is one digit larger as compared with Esaki diode. For the oscillation circuit, a circuit arrangement in which the inductance L and the load resistance RL are connected in parallel is also conceivable.

Second Applicable Example

Figure 22:
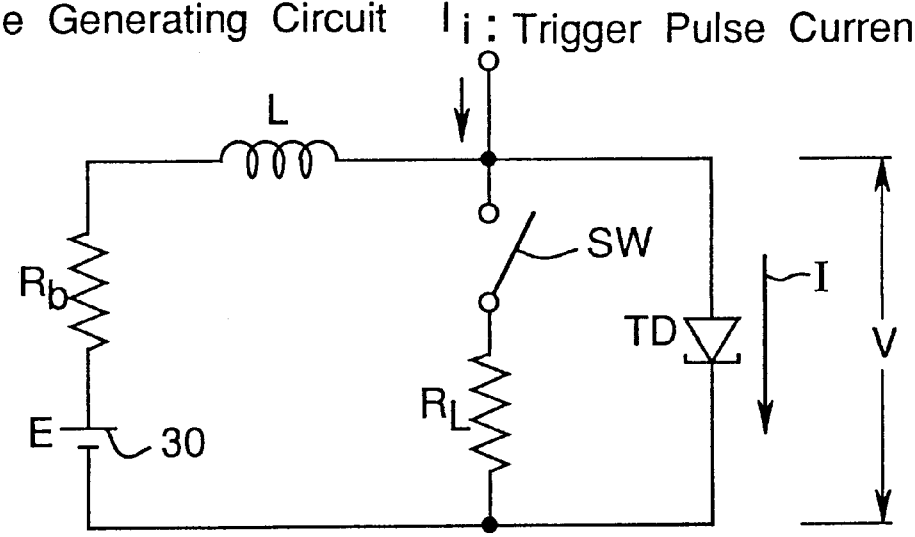
FIG. 22 is a circuit diagram showing a circuit configuration of a pulse generating circuit which is a second application example of the molecular-doped negative-resistance device shown in FIG. 1.
Figure 23:
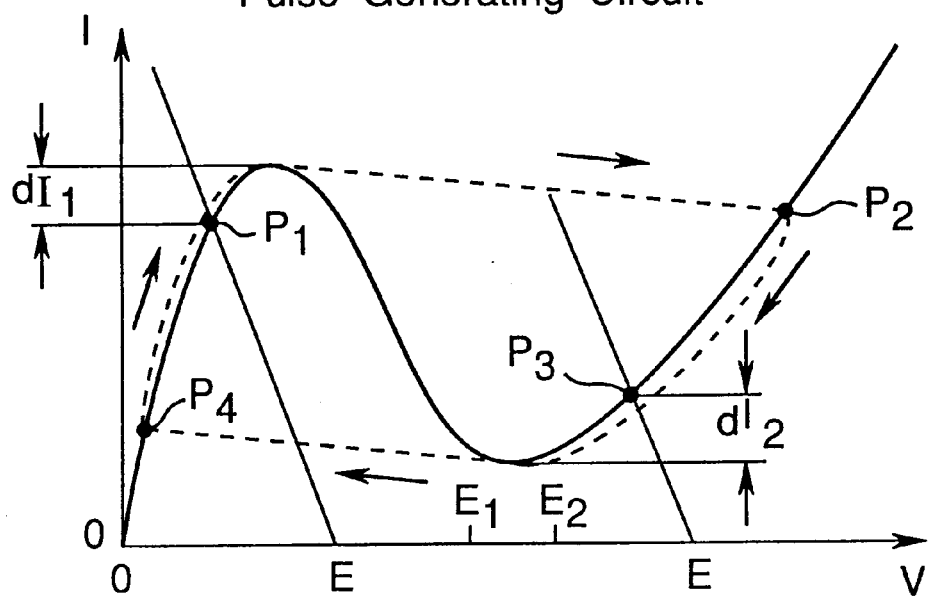
FIG. 23 is a graph showing operating points and a direct current load line in the pulse generating circuit shown in FIG. 22.
Figure 24:
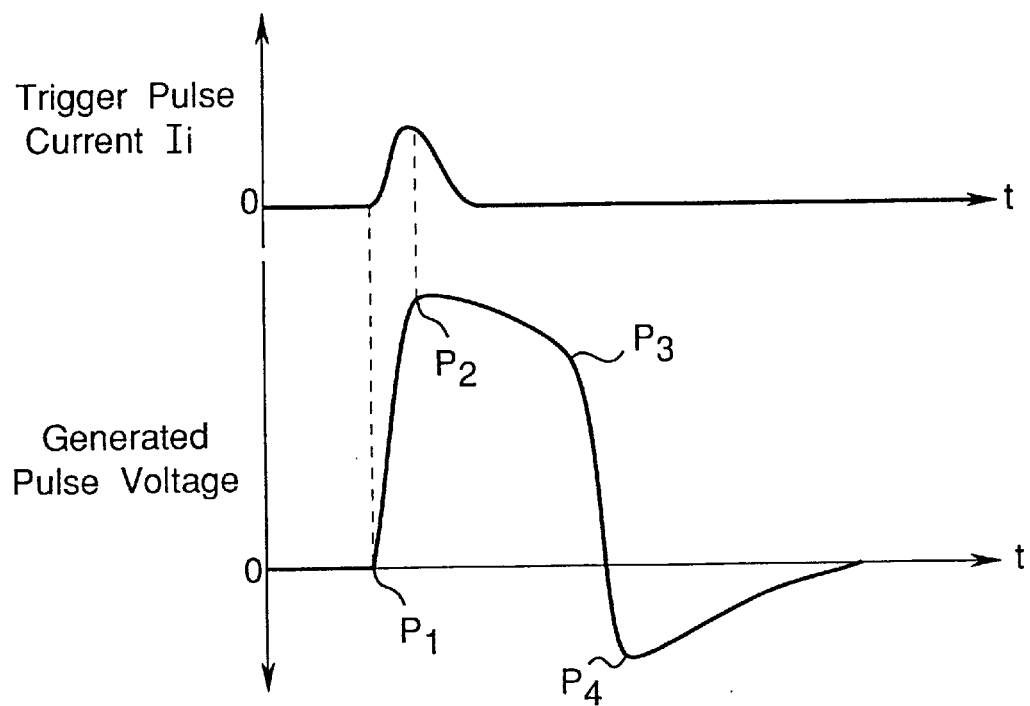
FIG. 24 is a signal wave form diagram showing a trigger pulse current and a generated pulse voltage which appear in the pulse generating circuit shown in FIG. 22 when a positive trigger pulse current is flowed through the circuit.
Figure 25:
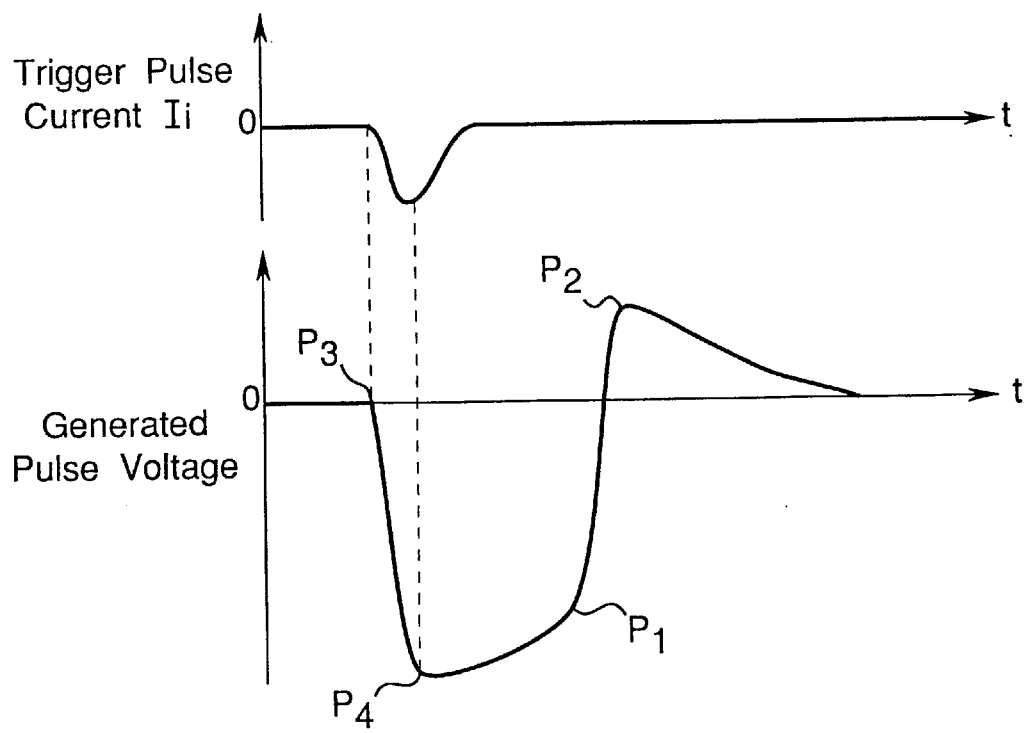
FIG. 25 is a signal wave form diagram showing a trigger pulse current and a generated pulse voltage which appear in the pulse generating circuit shown in FIG. 22 when a negative trigger pulse current is flowed through the circuit.

FIG. 22 is a circuit diagram showing a circuit configuration of a pulse generating circuit as a second application example of the molecular-doped negative-resistance device shown in FIG. 1, and FIG. 23 is a graph showing operating points and a DC load line in the pulse generating circuit. FIG. 24 is a signal waveform diagram showing a trigger pulse current and a generated pulse voltage which appear in the pulse generating circuit when a positive trigger pulse current is flowed into the circuit. FIG. 25 is a signal waveform diagram showing a trigger pulse current and a generated pulse voltage which appear in the pulse generating circuit when a negative trigger pulse current is flowed into the circuit.

In the circuit shown in FIG. 22, a series circuit of a switch SW and a load resistance $R_L$ is connected in parallel to the molecular-doped negative-resistance device TD, and a junction between the switch SW and the anode of the molecular-doped negative-resistance device TD is made to serve as an input point for trigger pulse current. A series circuit of an inductor L, a series resistance Rb and a DC bias power supply 30 is connected in parallel to the series circuit of switch SW and load resistance $R_L$.

This pulse generating circuit has a circuit configuration such that the inductor L and the series resistance Rb with a resistance value smaller than the negative-resistance value $(1/|Gd|)$ are connected in series to the molecular-doped negative-resistance device TD. As shown in FIG. 23, if the bias voltage E applied is lower than voltage $E_1$, the intersection point $P_1$ becomes a stable operating point. If the bias voltage E is higher than voltage $E_2$, the point $P_2$ becomes a stable operating point. If an input pulse current with an amplitude of $dI_1$ or more is applied to the molecular-doped negative-resistance device TD in the state of the operating point $P_1$, the molecular-doped negative-resistance device TD enters a negative-resistance (conductance) region and becomes unsteady. However, because of the inductance of the series inductor L, the current could not rapidly be decreased, and the operating point moves from $P_1$ to $P_2$ as shown by a broken line shown in FIG. 23. Along with this movement, there occurs a rapid increase in voltage V at the molecular-doped negative-resistance device TD. However, bias voltage E is not so high as to permit the operating point to stay at that point. Therefore, the current I flowing in the molecular-doped negative-resistance device TD is gradually reduced. Thus, the operating point moves from $P_2$ to $P_3$ and then again passes through the negative-resistance region to switch to the operating point $P_4$. Accompanying with this, the output voltage is reduced and then the device returns to the initial state of the operating point $P_1$, becoming thus stabilized. In this way, each time trigger pulse is applied, a positive output pulse can be obtained as shown in FIG. 24.

In a manner similar to that of above, in the case where the stabilization point is positioned at the point $P_3$, upon application of a negative trigger pulse having an amplitude of $dI_2$ or more, the operating point moves in the sequence of $P_3 \rightarrow P_4 \rightarrow P_1 \rightarrow P_2$, becoming stabilized at the point $P_3$. In this case, as shown in FIG. 25, a negative pulse voltage can be generated.

The range of output pulses is mainly determined by the inductance value of the series inductor L. If the inductance value is increased, the pulse range becomes wider. The leading time of the pulse voltage changes in correspondence with the switching time from $P_1$ to $P_2$ so that the greater the difference between the peak current and the valley current, or the PV ratio is, and the smaller the barrier capacitance is, the shorter the leading time is. The trailing time thereof changes in correspondence with the switching time from $P_3$ to $P_4$ so that the smaller the valley resistance defined by the valley voltage to valley current ratio is, and the smaller the barrier capacitance is, the shorter the trailing time is. When the load resistance $R_L$ is connected in parallel to the molecular-doped negative-resistance device TD, the output pulse voltage will decrease with the decrease in the resistance $R_L$.

Besides the above described application for pulse generating circuits, a flip-flop circuit having a load resistance $R_L$ connected in parallel to the molecular-doped negative-resistance device TD may be considered such that a trigger pulse current is caused to operate in conjunction with a constant current that is comparatively lower than peak current while the constant current is flowed into the circuit.

In the above-mentioned preferred embodiments and examples, the anode 2 and the cathode 4 are configured to have a strip-like shape in such a way that they intersect with each other at right angles as shown in FIG. 1. However, the present invention is not limited to this. The anode 2 and the cathode 4 may be formed on the entire surface thereof, or may be formed in a lattice-like pattern.

INDUSTRIAL APPLICABILITY

As described above, the molecular-doped negative-resistance device according to the present invention comprises a molecular-doped layer made of an electron transporting lower molecular organic compound, said molecular-doped layer being formed to be sandwiched between a pair of electrodes, wherein respective molecules of said electron transporting lower molecular organic compound are isolated from one another by an electrically insulating organic polymer, wherein said molecular-doped negative-resistance device has a negative-resistance.

Accordingly, the device includes an electrically insulating organic polymer in which electronic carrier transporting lower molecular organic compound is doped, and then the electrodes sandwiches the same, namely, the electrodes includes the anode metal having a larger work function, and the cathode metal having a smaller work function or a cathode metal having a larger work function. The electrically insulating organic polymer and the lower molecular organic compound serve as a potential barrier and as a carrier transporting molecule, respectively. The rectifying characteristics can be obtained by controlling the barrier against tunnel injection at the interface between the electrode and the lower molecular organic compound to thereby inject only one of hole and electron carriers. The negative-resistance can be obtained through polarization due to carrier trap of the lower molecular organic compound in the process of the tunnel injection at the electrode interface and in the process of the tunnel electric conduction of tunnel-injected hole or electron through the bulk, and also by relative positions of the LUMO level, the HOMO level, and the Fermi level of the electrode metals which vary due to external electric field. The molecular-doped negative-resistance device exhibits good negative-resistance characteristic, good switching characteristic, and good rectification characteristic at a room temperature, and can therefore be used in constructing switching devices and logical devices.

In the molecular-doped negative-resistance device according to the present invention, little or no surface level is formed at the interface between the electrically insulating organic polymer and the lower molecular organic compound. Therefore, the device involves little or no deterioration due to such surface level. The device affords a substantial freedom of material selection because many kinds of organic materials can be used. The molecular device of the present invention has high mechanical strength and thermal stability because an organic polymer material is used therein. Further, because of the fact that molecules of a lower molecular organic compound such as TPD are doped in the electrically insulating organic polymer, agglomeration of such lower molecules is inhibited. Therefore, the interaction of carrier transporting molecules can be minimized, the device being thus prevented from deterioration.

The interface between the electrically insulating organic polymer and the lower molecular organic compound is subject to the influence of moisture, but by coating the entire device with resin or the like for protection it is possible to prevent deterioration due to the moisture. The molecular-doped negative-resistance device according to the present invention can be widely used in applications such as oscillator, switching device, and logical element. Further, the device is very simple in construction and can be formed in a thin film configuration in the atmosphere. Therefore, the device has a good processability. It is necessary, however, to use good care for moisture and dust control in the process of film forming. Moreover, the present invention does not require the use of any costly ultra-high vacuum apparatus and this enables industrial mass production of the device at lower manufacturing cost.

I claim:

1. A molecular-doped negative-resistance device comprising:

a molecular-doped layer (2) made of an electron transporting lower molecular organic compound, said molecular-doped layer (2) being formed to be sandwiched between a pair of electrodes (2, 4), wherein respective molecules of said electron transporting lower molecular organic compound are isolated from one another by an electrically insulating organic polymer, wherein said molecular-doped negative-resistance device has a negative-resistance.

2. The molecular-doped negative-resistance device as claimed in claim 1, wherein the molecular-doped layer (2) has a multiple barrier type molecular-doped structure, such that contacts each between the organic polymer and a molecule of the lower molecular organic compound are repeated in an alternate order of the organic polymer and the molecule of the lower molecular organic compound, by doping the lower molecular organic compound in the electrically insulating organic polymer.

3. The molecular-doped negative-resistance device as claimed in claim 1 or 2, wherein the lower molecular organic compound is a triphenyldiamine derivative or 8-hydroxy-quinoline aluminum, and wherein the organic polymer is poly (N-vinylcarbazole) or polystyrene.

4. A method for manufacturing a molecular-doped negative-resistance device including the following steps of:

forming a first electrode (2) on a substrate (1);

doping an electronic carrier transporting lower molecular organic compound into an electrically insulating organic polymer, thereby forming a negative-resistance material having a multiple barrier type molecular-doped structure such that contacts each between the organic polymer and a molecule of the lower molecular organic compound are repeated in an alternate order of the organic polymer and the molecule of the lower molecular organic compound;

forming a molecular doping layer (3) by forming said formed negative-resistance material on the first electrode (2) using a dip coating method or a spin coating method; and forming a second electrode (4) on the molecular-doped layer (3).

5. The method for manufacturing a molecular-doped negative-resistance device as claimed in claim 4, wherein the lower molecular organic compound is a triphenyldiamine derivative or 8-hydroxy-quinoline aluminum, and wherein the organic polymer is poly (N-vinylcarbazole) or polystyrene.

* * * * *